United States Patent
Chudzik et al.

(10) Patent No.: US 8,012,863 B2
(45) Date of Patent: Sep. 6, 2011

(54) TRANSISTORS WITH GATE STACKS HAVING METAL ELECTRODES

(75) Inventors: Michael Patrick Chudzik, Danbury, CT (US); Paul Daniel Kirsch, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 1645 days.

(21) Appl. No.: 11/306,670

(22) Filed: Jan. 6, 2006

(65) Prior Publication Data

US 2007/0161198 A1 Jul. 12, 2007

(51) Int. Cl.
*H01L 21/3205* (2006.01)
(52) U.S. Cl. ......... 438/585; 438/584; 438/583; 438/596
(58) Field of Classification Search ............ 438/585, 438/584, 583, 596
See application file for complete search history.

(56) References Cited

U.S. PATENT DOCUMENTS

| | | | |
|---|---|---|---|
| 6,110,784 A | 8/2000 | Gardner et al. | |
| 6,245,605 B1 | 6/2001 | Hwang et al. | |
| 6,368,923 B1 | 4/2002 | Huang | |
| 6,436,775 B2 | 8/2002 | Kim et al. | |
| 6,645,779 B2 | 11/2003 | Hong | |
| 2006/0019493 A1* | 1/2006 | Li | 438/680 |
| 2007/0134861 A1* | 6/2007 | Han et al. | 438/197 |

OTHER PUBLICATIONS

Kirsch, et al.; Chemical and Thermal Reduction of Thin Films of Copper(II) oxide and copper (I) oxide; 2001 American Institute of Physics; Journal of Applied Physics; vol. 90, No. 8; Oct. 15, 2001; pp. 4256-4264.

Aboelfotoh, et al.; Process to Prove Reliability of Refractory Metal Gate MOS Devices; IBM Technical Disclosure Bulletin; vol. 30, No. 7; Dec. 1987; pp. 255-256.

Niimi, et al.; Reaction pathways in remote plasma nitridation of ultrathin $SiO_2$ films; 2002 American Institute of Physics; Journal of Applied Physics; vol. 91, No. 1; Jan. 1, 2002; pp. 48-55.

Metal Gate Structure Compatible with High Temperature Oxidation Processes; IBM Technical Disclosure Bulletin; Aug. 1989; Order/Fcode/Docket: 89A 63449//BU8880093.

Lysaght, et al.; Probing High-k Interfaces;Mar. 9, 2004; International SEMATECH; Review of FEPG001 for GSEWG review Nov. 2003; Portions of this document are either International SEMATECH (ISMT) Confidential or ISMT Confidential (AMAT, ANELVA, AVIZA Sensitive) as marked; 26 pages.

* cited by examiner

*Primary Examiner* — Thinh T Nguyen
(74) *Attorney, Agent, or Firm* — Schmeiser, Olsen & Watts; Ian D. MacKinnon (57) ABSTRACT

A transistor with a gate stack having a metal electrode and a method for forming the same. The method includes providing a structure which includes (a) a substrate, (b) a gate dielectric layer on the substrate, and (c) a gate layer on the gate dielectric layer. The gate layer includes an oxidized layer. The oxidized layer comprises an oxidized material. Then, the structure is exposed to a first plasma resulting in removal of oxygen atoms from molecules of the oxidized material.

18 Claims, 9 Drawing Sheets

FIG. 10

TRANSISTORS WITH GATE STACKS HAVING METAL ELECTRODES

BACKGROUND OF THE INVENTION

1. Technical Field

This invention relates to gate stacks in transistors, and more specifically, to gate stacks having metal gate electrodes.

2. Related Art

In a typical semiconductor transistor comprising a gate stack, penetration of oxygen into the gate stack during fabrication is becoming a serious problem. Therefore, there is a need for a structure (and a method for fabricating the same) that has less oxygen in the gate stack than in the prior art.

SUMMARY OF THE INVENTION

The present invention provides a semiconductor fabrication method, comprising providing a structure which includes (a) a substrate, (b) a gate dielectric layer on the substrate, and (c) a gate layer on the gate dielectric layer, wherein the gate layer comprises an oxidized layer, and wherein the oxidized layer comprises an oxidized material; and exposing the structure to a first plasma resulting in removal of oxygen atoms from molecules of the oxidized material.

The present invention also provides a semiconductor fabrication method, comprising providing a structure which includes (a) a substrate, (b) a gate dielectric layer on the substrate, and (c) a gate layer on the gate dielectric layer, wherein the gate layer comprises an oxidized layer, and wherein the oxidized layer comprises an oxidized material; and exposing the structure to a first plasma resulting in removal of oxygen atoms from molecules of the oxidized material; and forming a polysilicon layer on the oxidized layer after said exposing the structure to the first plasma is performed, wherein said exposing the structure to the first plasma is performed such that first atoms of the removed oxygen atoms are pushed out of the oxidized layer, and such that second atoms of the removed oxygen atoms chemically react with species of the first plasma to form a volatile substance.

The present invention also provides a semiconductor fabrication method, comprising providing a structure which includes (a) a substrate, (b) a gate dielectric layer on the substrate, and (c) a gate layer on the gate dielectric layer, wherein the gate layer comprises an oxidized layer, and wherein the oxidized layer comprises an oxidized material; and exposing the structure to a first plasma resulting in removal of oxygen atoms from molecules of the oxidized material; and forming a polysilicon layer on the oxidized layer after said exposing the structure to the first plasma is performed, wherein said exposing the structure to the first plasma and said forming the polysilicon layer on the oxidized layer are performed in a controlled environment which essentially does not contain oxygen atoms, and wherein said exposing the structure to the first plasma is performed such that first atoms of the removed oxygen atoms are pushed out of the oxidized layer, and such that second atoms of the removed oxygen atoms chemically react with species of the first plasma to form a volatile substance.

The present invention provides a structure (and a method for fabricating the same) that has less oxygen in the gate stack than in the prior art.

DETAILED DESCRIPTION OF THE INVENTION

FIGS. 1-10 show the fabrication process for forming a structure 100, in accordance with embodiments of the present invention.

Figure 1:
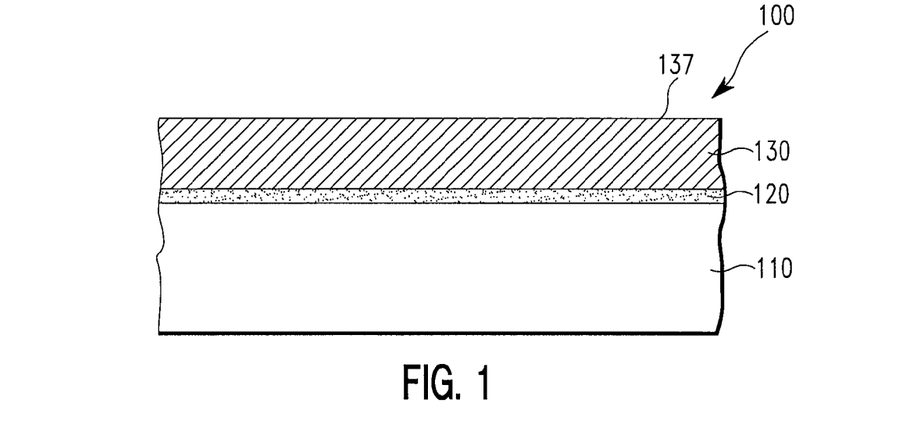
FIGS. 1-10 show the fabrication process for forming a structure, in accordance with the embodiment of the invention.

More specifically, with reference to FIG. 1, in one embodiment, the fabrication process starts with a semiconductor substrate 110. The semiconductor substrate 110, in one embodiment, comprises silicon or germanium.

Next, in one embodiment, a gate dielectric layer 120 is formed on top of the semiconductor substrate 110. Illustratively, the gate dielectric layer 120 comprises silicon dioxide ($SiO_2$) or a high-k dielectric material (k is dielectric constant). In one embodiment, the gate dielectric layer 120 is formed by thermal oxidation. In an alternative embodiment, the gate dielectric layer 120 is formed on top of the semiconductor substrate 110 by CVD (Chemical Vapor Deposition).

Next, in one embodiment, an electrically conducting layer 130 is formed on top of the gate dielectric layer 120. Illustratively, the electrically conducting layer 130 (which can also be referred to as the gate layer 130) comprises a metal such as Cu, Ta, Ti, W, Hf or a metal nitride such as TaN, TiN, WN, TaSiN, TiAlN, and/or HfN. In one embodiment, the electrically conducting layer 130 is formed by CVD or PVD (Physical Vapor Deposition).

With reference to FIG. 1, after the formation of the electrically conducting layer 130, if the structure 100 is taken from one tool to another for further processing, then oxygen of the surrounding ambient may penetrate through a top surface 137 into the electrically conducting layer 130. Then, some of the penetrating oxygen that penetrates into the electrically conducting layer 130 may chemically react with the material of the electrically conducting layer 130 to form an oxidized material. Therefore, a top layer of the electrically conducting layer 130, which comprises a substantial portion of the created oxidized material and is close to the top surface 137, can be referred to as an oxidized layer 131 of FIG. 2. The rest of the electrically conducting layer 130 can be referred to as a remaining electrically conducting layer 130.1.

Figure 2:
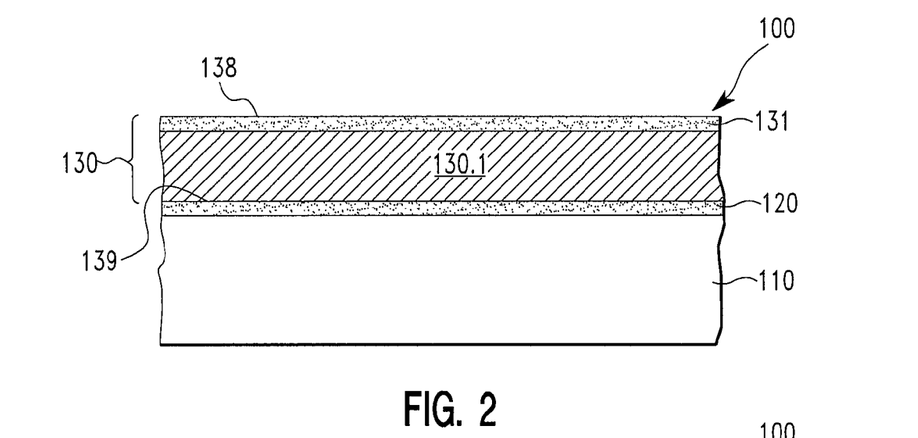

With reference to FIG. 2, the oxidized layer 131 may comprise the penetrating oxygen, the oxidized material, and the material of the electrically conducting layer 130. It should be noted that the densities of the penetrating oxygen and the oxidized material in the electrically conducting layer 130 gradually decrease from a top surface 138 of the oxidized layer 131 to a bottom surface 139 of the remaining electrically conducting layer 130.1. However, because a substantial portion of the penetrating oxygen and the created oxidized material resides in the oxidized layer 131, therefore, to simplify description of the invention, it is reasonable to assume that the penetrating oxygen and the oxidized material are present only in the oxidized layer 131. As a result, it should be understood that the border between the oxidized layer 131 and the remaining electrically conducting layer 130.1 in the figures is intended to make this invention easily describable. In other words, there is no clear-cut border between the oxidized layer 131 and the remaining electrically conducting layer 130.1.

With continued reference to FIG. 2, in one embodiment, a first plasma exposing step is performed so as to expose the structure 100 to a first plasma (not shown). In general, during the first plasma exposing step, a volatile material is created in the oxidized layer 131, and a portion of which escapes the oxidized layer 131. The volatile material can comprise pure oxygen and/or volatile substance(s) whose molecules contain oxygen atoms (a volatile material is a material that can be readily vaporized at normal temperatures and pressures). The pure oxygen of the volatile material may comprise (i) some oxygen atoms that are a part of the penetrating oxygen, and/or (ii) some oxygen atoms that are removed from the molecules of the oxidized material by the first plasma. The volatile substance(s) of the volatile material can be a result of the chemical reaction between oxygen in the oxidized layer 131 and the species of the first plasma.

Next, in one embodiment, the structure 100 is heated at a pre-specified temperature so as to push more of the volatile material (i.e. pure oxygen and the volatile substance(s)) out of the oxidized layer 131, resulting in a change in the material of the oxidized layer 131. As a result, the oxidized layer 131 can be, hereinafter, referred to as a plasma exposed layer 132 (FIG. 3) to indicate this change in material.

In the embodiments described above, the first plasma exposing step is performed, and then the heating step is performed at the pre-specified temperature. In an alternative embodiment, the first plasma exposing step is performed at the pre-specified temperature. In other words, the first plasma exposing step and the heating step are performed at the same time.

In one embodiment, the plasma used in the first plasma exposing step can be N plasma, H plasma, NH3 plasma, or CH4 plasma. Which of the mentioned plasmas is preferred depends on the material of the electrically conducting layer 130. For instance, if the material of the electrically conducting layer 130 comprises nitrogen (for example, TaN, TiN, WN, TaSiN, TiAlN, and HfN), then nitrogen plasma can be used. In one embodiment, the nitrogen plasma condition can be 50 W to 1000 W, 5 mT to 500 mT, 1 second to 300 seconds, with temperature in a range from room temperature to 800C.

Figure 3:
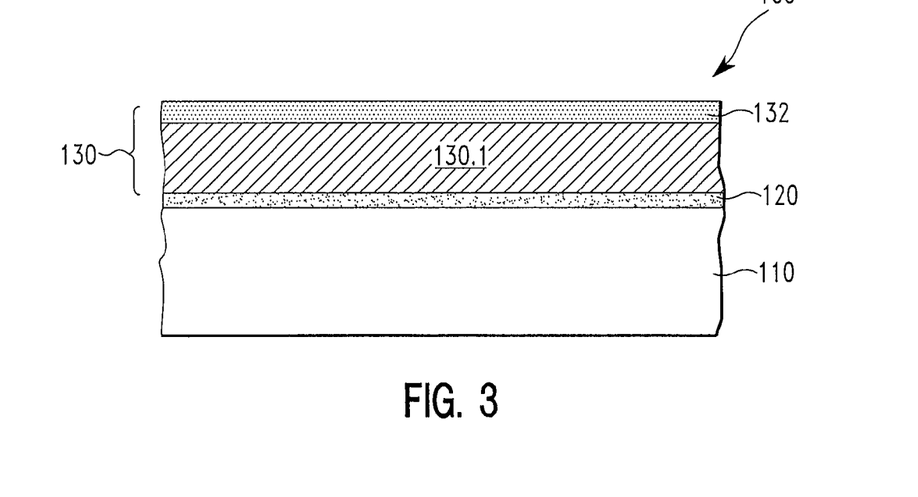

During the first plasma exposing step using nitrogen plasma, some of the oxygen atoms in the oxidized layer 131 chemically react with Nitrogen species of the first plasma to form NO and/or NO2 (i.e., the volatile substances whose molecules contain oxygen atoms). Some of these NO and/or NO2 may escape the oxidized layer 131. Then, during the subsequent heating step, more NO and/or NO2 and oxygen (i.e., the volatile material) escapes the oxidized layer 131, resulting in the plasma exposed layer 132 (FIG. 3).

If the material of the electrically conducting layer 130 comprises a pure metal such as copper, then the first plasma used can be Deuterium plasma or Hydrogen plasma. Then, during the first plasma exposing step, some of oxygen atoms of the Cu2O (i.e., oxidized material) in the oxidized layer 131 may chemically react with Deuterium (or Hydrogen) species of the first plasma to form water vapor (i.e., volatile substance), some of which escapes the oxidized layer 131. Then, during the subsequent heating step, more water vapor and oxygen (i.e., the volatile material) escapes the oxidized layer 131, resulting in the plasma exposed layer 132 (FIG. 3).

Figure 4:
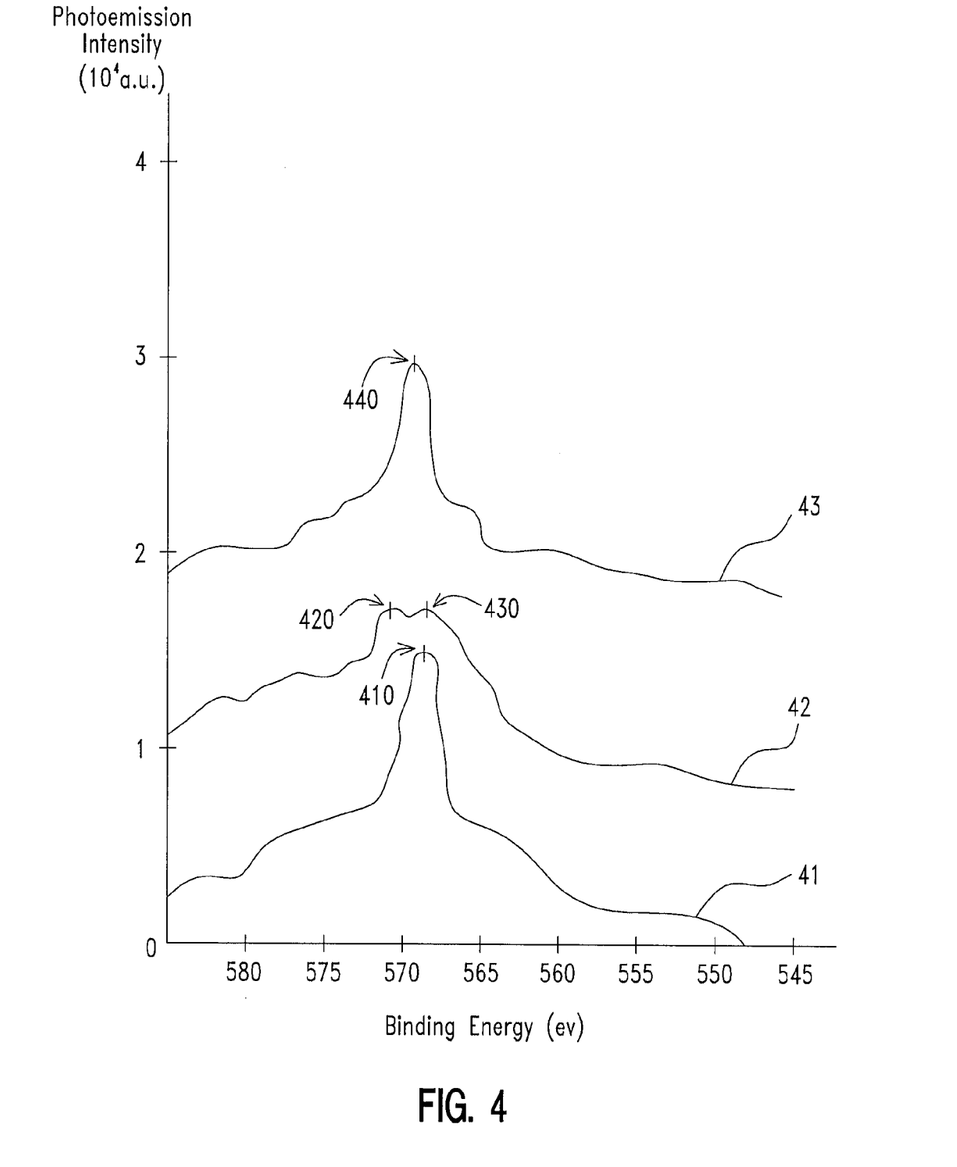

FIG. 4 shows the effect of the first plasma exposing step for the case in which the electrically conducting layer 130 comprises copper and the first plasma used is Deuterium plasma (in short, D plasma—ydrogen isotope plasma). FIG. 4 is an excerpt (more specifically, FIG. 1) from the article "Chemical and thermal reduction of thin films of copper (ii) and oxide and copper (I) oxide" by P. D. Kirsch and J. G. Ekerdt published in Journal Of Applied Physics, Volume 90, Number 8, 15 Oct. 2001. In that case, the oxidized layer 131 (FIG. 2) comprises copper oxide as a result of copper of the electrically conducting layer 130 chemically reacting with penetrating oxygen atoms of the surrounding ambient. In FIG. 4, curve 41 corresponds to the case where the electrically conducting layer 130 of the structure has just been formed. Curve 41 has one peak 410 (at 568.2 eV corresponding to pure Cu) which indicates that the electrically conducting layer 130 comprises essentially only copper. Curve 42 corresponds to the case where the oxidized layer 131 of the structure 100 in FIG. 2 is formed but before the first exposing step is performed. Curve 42 has two peaks 420 and 430 (at 570.1 eV ($Cu^{1+}$) and 568.2 eV)($Cu^0$), respectively) which indicate that some of the copper of the electrically conducting layer 130 is oxidized by the penetrating oxygen of the surrounding ambient. Curve 43 corresponds to the case where the structure 100 in FIG. 2 has been exposed to the first plasma exposing step using D plasma. Curve 43 has one peak 440 (at 568.2 eV corresponding to pure Cu), which indicates that the electrically conducting layer 130 comprises essentially only copper.

Figure 5:
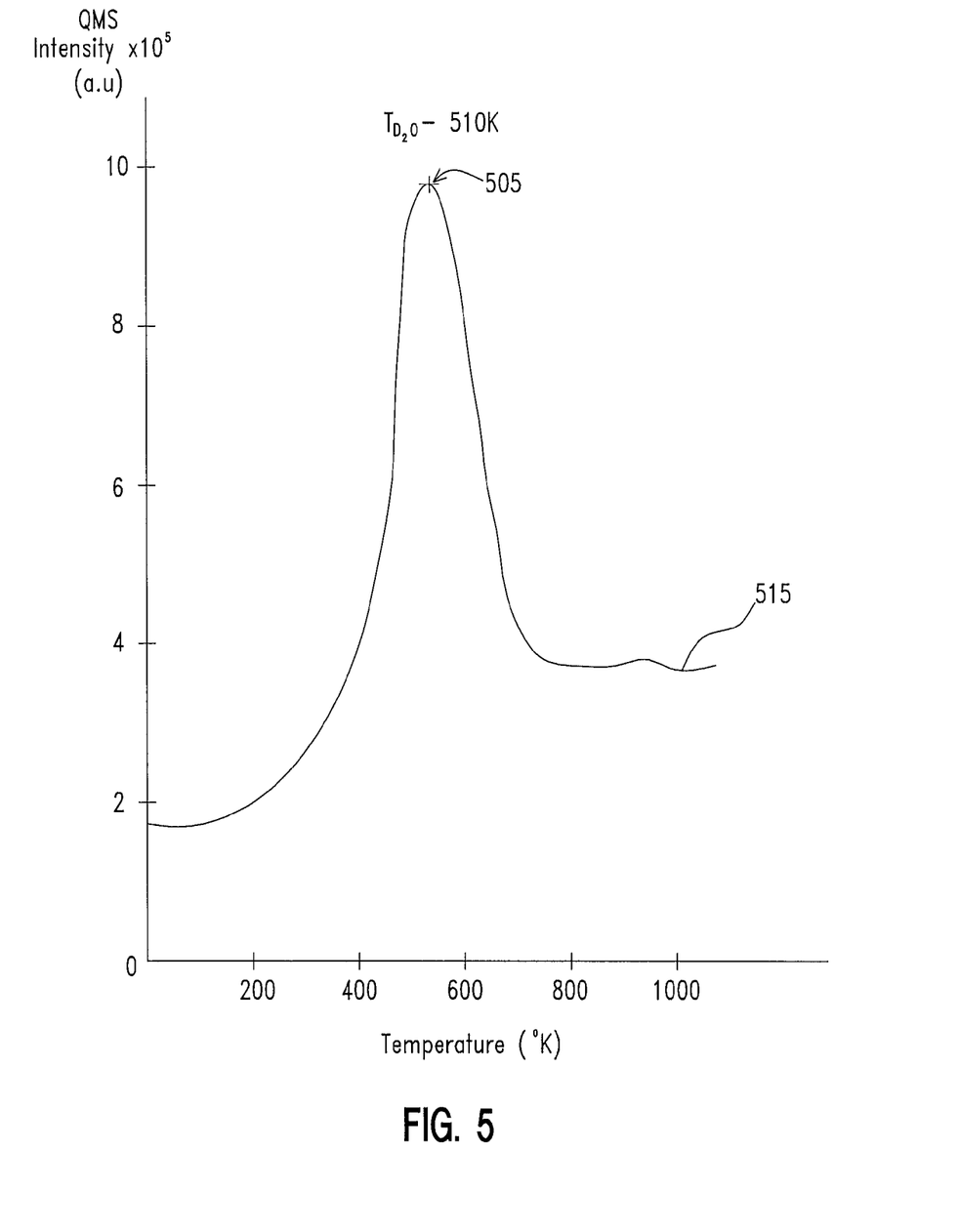

FIG. 5 shows the effect of the first plasma exposing step wherein the electrically conducting layer 130 comprises copper and the first plasma used is D plasma. The peak 505 of curve 515 illustrates that when the structure 100 of FIG. 2 is heated at 510° K, after the first plasma exposing step is performed, a lot of water vapor escapes the structure 100. This indicates that the oxygen atoms in the structure 100 chemically react with hydrogen atoms of the D plasma during the first plasma exposing step, resulting in the plasma exposed layer 132 (FIG. 2).

In one embodiment, the first plasma exposing step is performed at t=510° K, so that most of the water vapor which is created as described above escapes the structure 100 as soon as the water vapor is created in the oxidized layer 131.

Figure 6:
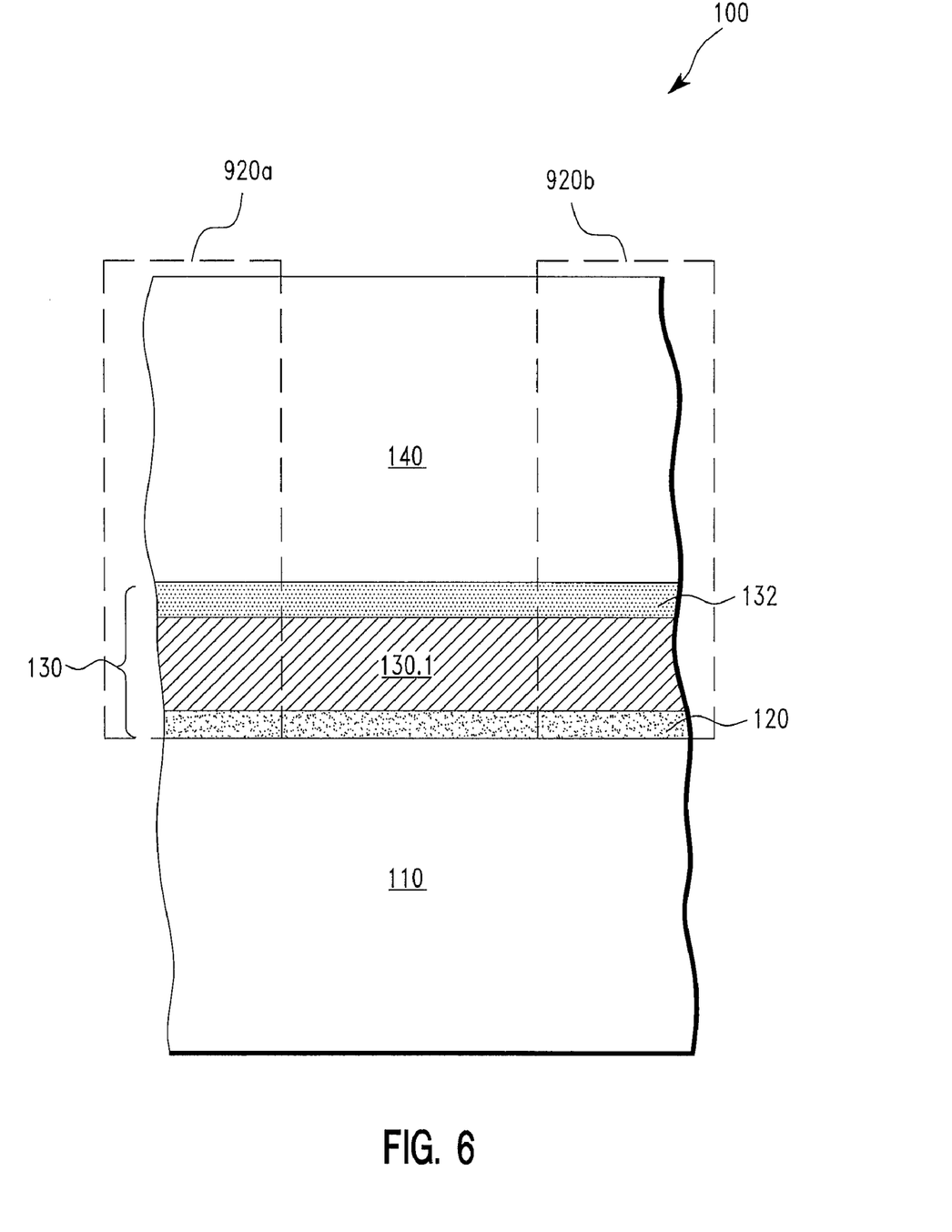

Next, with reference to FIG. 6, in one embodiment, after the first plasma exposing step is performed, a polysilicon layer 140 is deposited on top of the plasma exposed layer 132 of the structure 100 of FIG. 3 by CVD. In one embodiment, the first plasma exposing step and the deposition of polysilicon layer 140 are performed in a controlled environment which comprises essentially no oxygen atoms, such that the structure 100 in FIG. 3 right after the first exposing plasma step until the deposition of polysilicon layer 140, is not exposed to oxygen atoms.

Figure 7A:
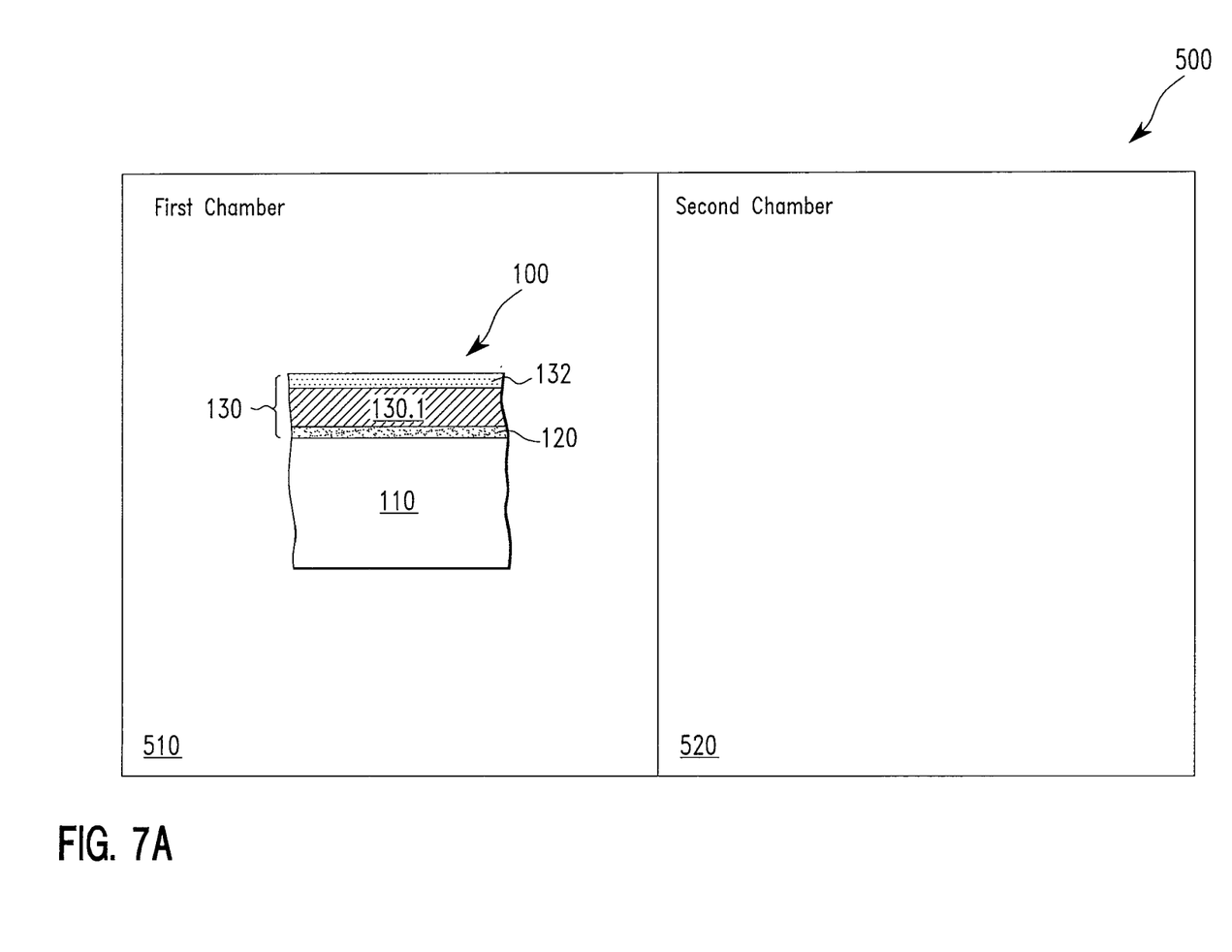
Figure 7B:
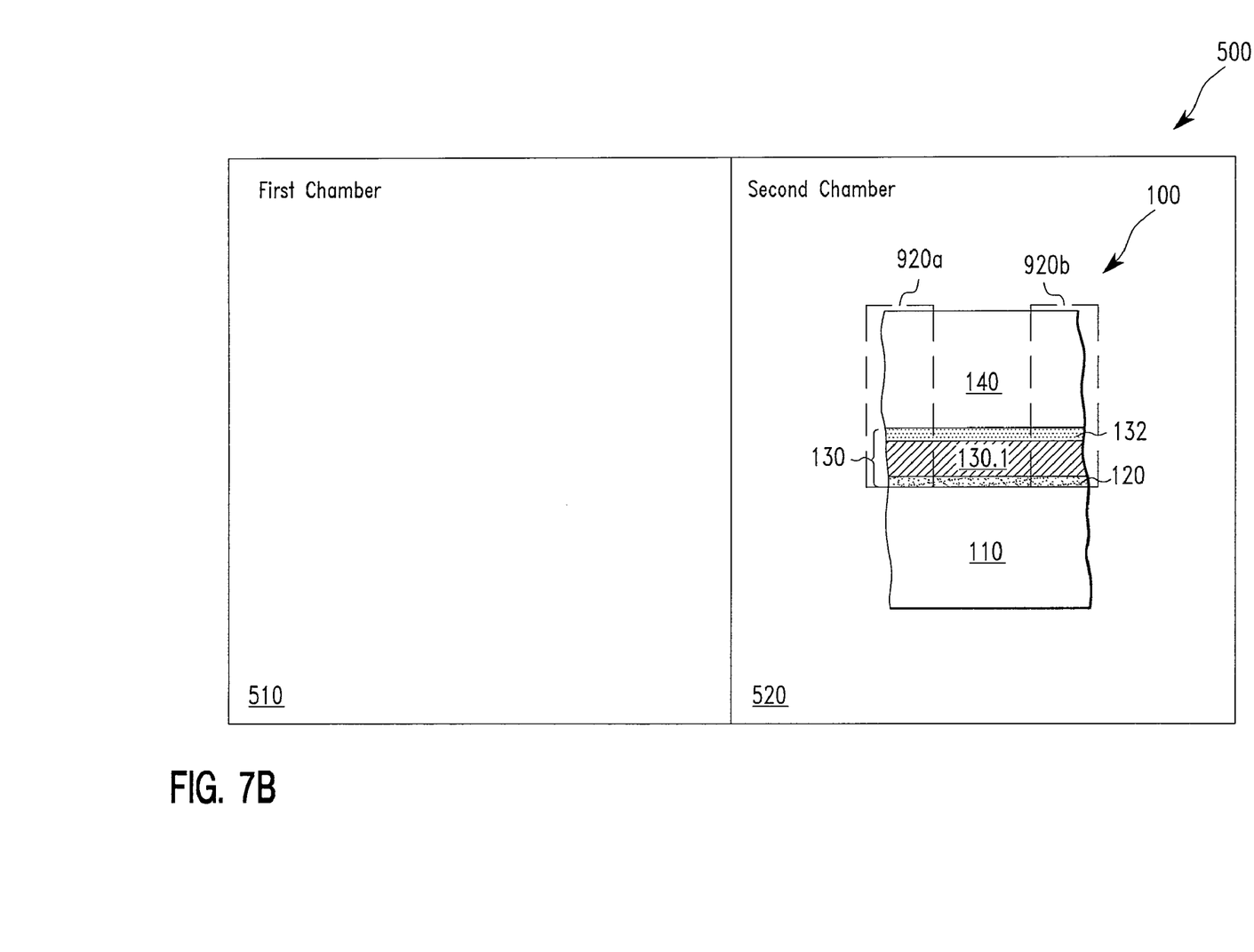

More specifically, with reference to FIGS. 7a and 7b, a tool 500 which includes a first chamber 510 and a second chamber 520 can serve as the controlled environment mentioned above (i.e., an environment in which oxygen has been removed such as by depressurization). In one embodiment, the first plasma exposing step can be performed in the first chamber 510 (FIG. 7a), and then, after that the structure 100 of FIG. 3 can be transferred from the first chamber 510 to the second chamber 520 (FIG. 7b) in which the polysilicon layer 140 is deposited. During the transfer of the structure 100 from the first chamber 510 to the second chamber 520, the structure 100 is not exposed to oxygen. In other words, the environment inside the tool 500 is controlled so that the structure 100 is not exposed to oxygen.

Figure 8:
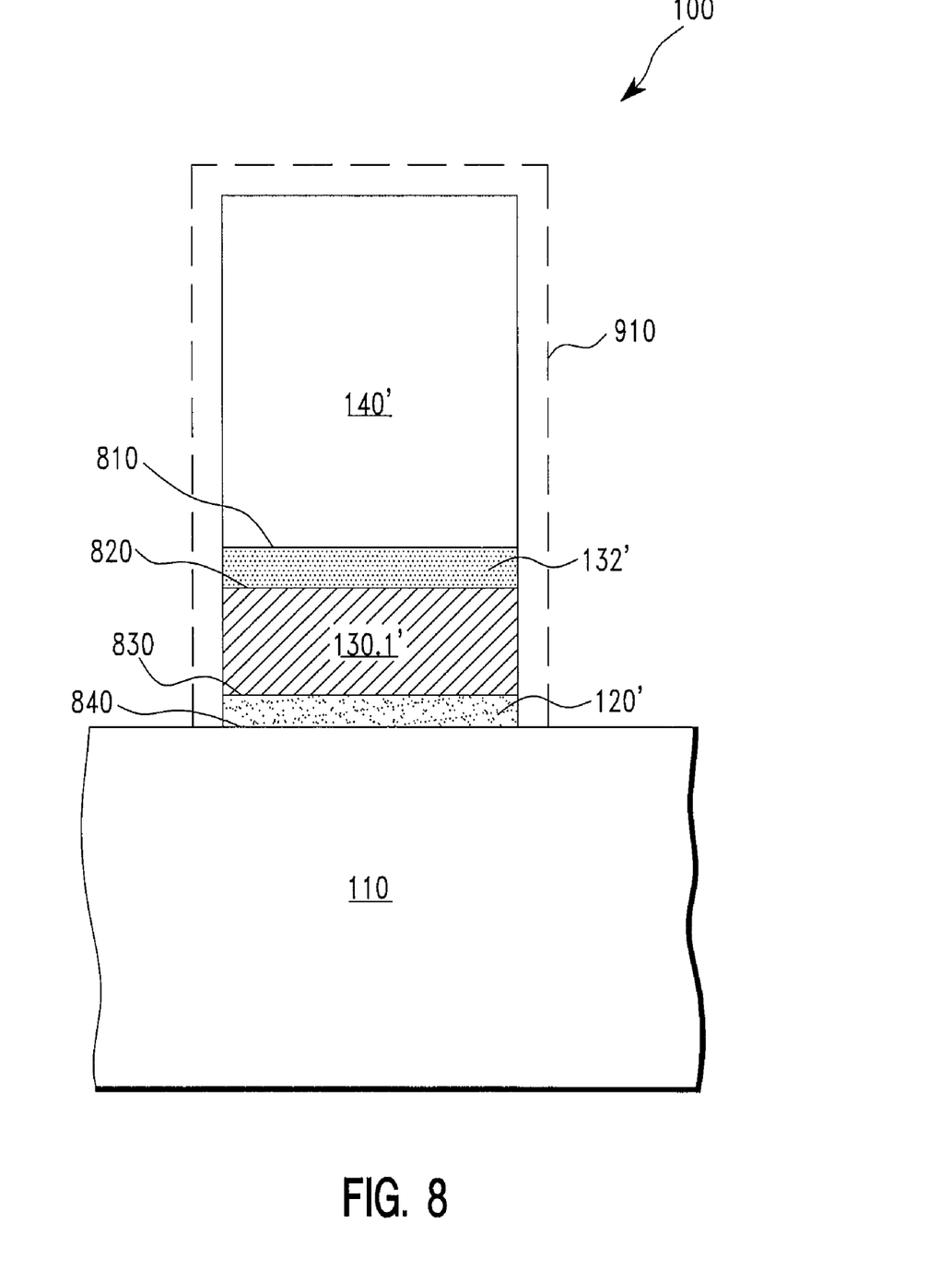

Next, with reference FIG. 6, in one embodiment, a lithographic and selective etching step is performed to etch portions 920a and 920b of the layers 140, 130, and 120 of the structure 100, stopping at the semiconductor substrate 110, so as to form the gate stack 910 (FIG. 8), resulting in the structure 100 of FIG. 8. As a result, what remain of the gate dielectric layer 120, the remaining electrically conducting layer 130.1, the plasma exposed layer 132, and the polysilicon layer 140 of FIG. 6 are a gate dielectric region 120', an electrically conducting region 130.1', a plasma exposed region 132', and a polysilicon region 140', respectively of FIG. 8.

After the lithographic and etching step, in one embodiment, if the structure 100 of FIG. 8 is exposed to a surrounding ambient that contains oxygen, then oxygen of the surrounding ambient is likely to penetrate laterally into the gate stack 910 along (i) interfacing surface 810 between the polysilicon region 140' and plasma exposed region 132', (ii) interfacing surface 820 between plasma exposed region 132' and the electrically conducting region 130.1', (iii) interfacing surface 830 between the electrically conducting region 130.1' and gate dielectric region 120', and (iv) interfacing surface 840 between gate dielectric region 120' and semiconductor substrate 110.

Figure 9:
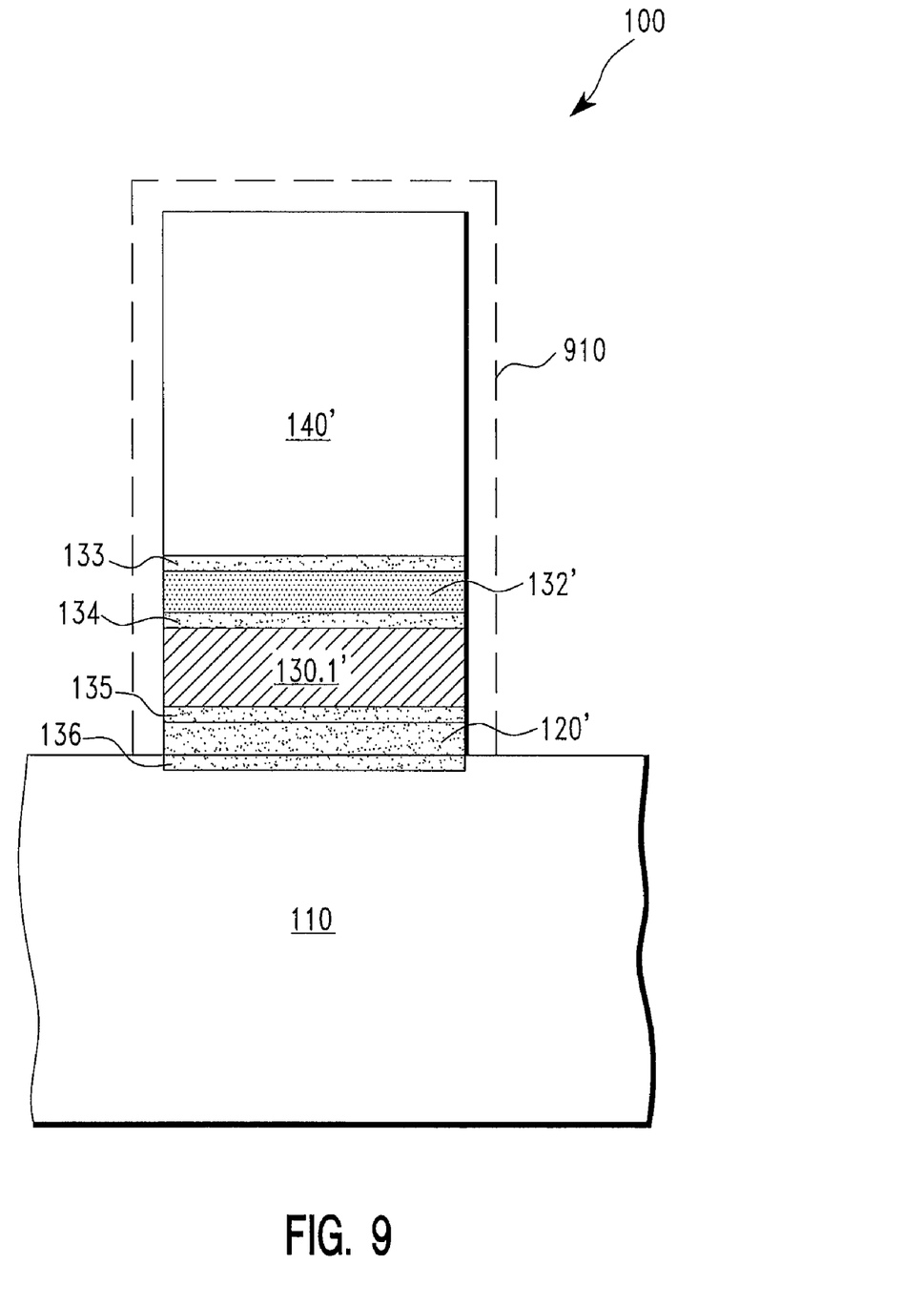

As a result, some of the penetrating oxygen may chemically react with the materials at the interfacing surfaces 810, 820, 830, and 840, resulting in oxidized interface regions 133, 134, 135, and 136, as shown in FIG. 9. This increases the resistance of the gate stack 910 of FIG. 9.

Figure 10:
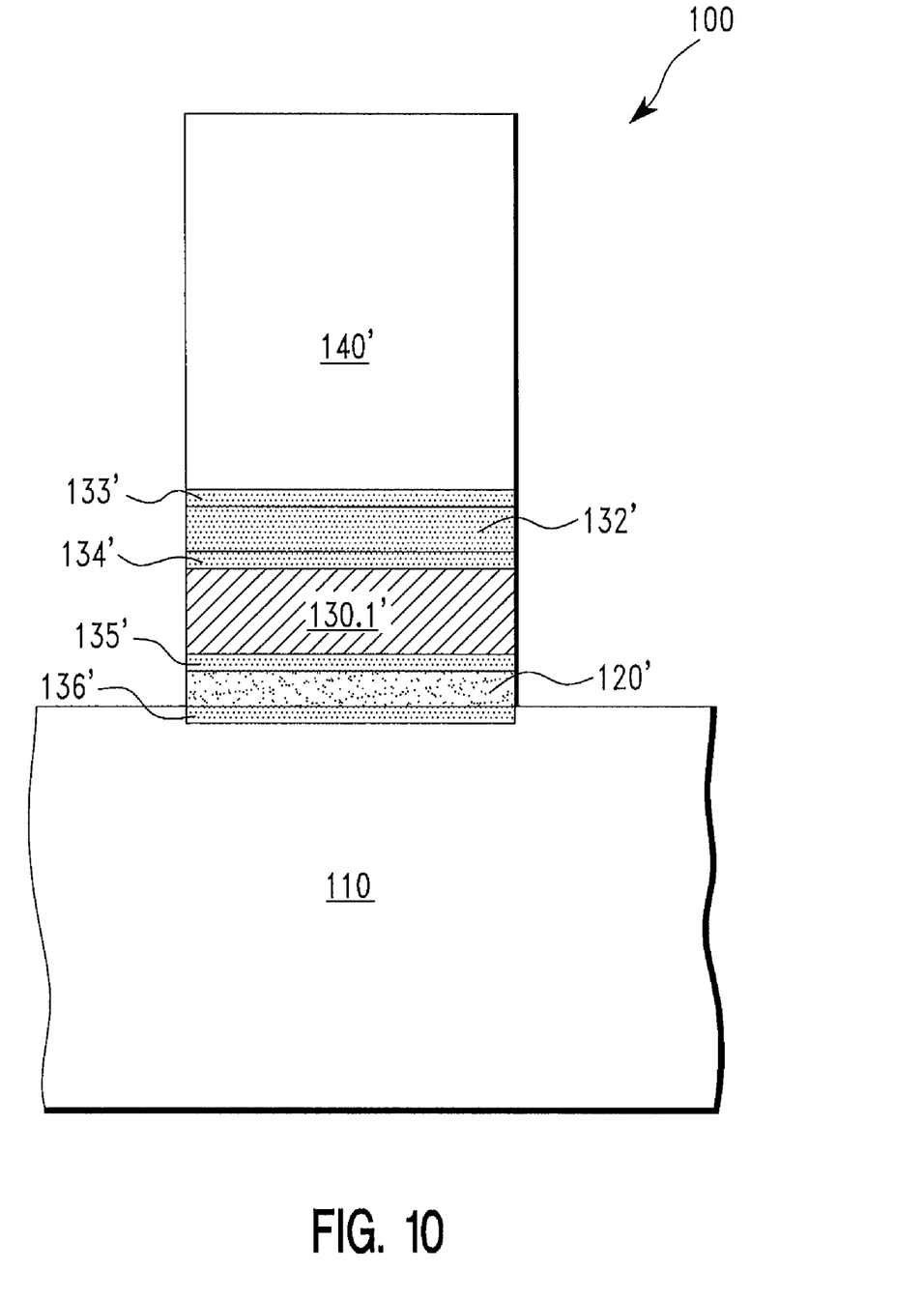

Next, with reference to FIG. 10, in one embodiment, a second plasma exposing step is performed so as to expose the structure 100 to a second plasma. As a result of the second exposing plasma step, some oxygen atoms in the oxidized material of the oxidized interface regions 133, 134, 135, and 136 are pushed out of the gate stack 910. In one embodiment, the second plasma exposing step and the first plasma exposing step are performed in similar conditions (i.e., similar pressures, temperatures, and duration, etc.)

More specifically, the second plasma used in the second plasma exposing step can be N plasma, H plasma, NH3 plasma, or CH4 plasma. Which of the mentioned plasmas is preferred depends on the material of the electrically conducting layer 130. For instance, if the material of the electrically conducting layer 130 comprises nitrogen (for example, TaN, TiN, WN, TaSiN, TiAlN, and HfN), then nitrogen plasma can be used. In one embodiment, the nitrogen plasma condition can be 50 W to 1000 W, 5 mT to 500 mT, 1 second to 300 seconds, with temperature in a range from room temperature to 800C.

As a result of the second plasma exposing step, some oxygen atoms are pushed out of the oxidized interfacing regions 133, 134, 135, and 136, resulting in a change in the material of the oxidized interfacing regions 133, 134, 135, and 136. As a result, the oxidized interfacing regions 133, 134, 135, and 136 can be referred to as plasma exposed regions 133', 134', 135', and 136', respectively.

After the gate stack 910 is formed, other features (not shown) of the structure 100 can be formed so as to form a transistor using a conventional method.

In summary, as a result of the first and second plasma exposing steps mentioned above, with reference to FIG. 10, some of oxygen atoms that penetrated from the surrounding ambient into the gate stack 910 of structure 100 are pushed out of the gate stack 910. Therefore, the resistance of gate stack 910 is reduced.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:
providing a structure which includes (a) a substrate, (b) a gate dielectric layer on the substrate, and (c) a gate layer on the gate dielectric layer, wherein the gate layer comprises an oxidized layer, and wherein the oxidized layer comprises an oxidized material;
exposing the structure to a first plasma resulting in removal of oxygen atoms from molecules of the oxidized material; and
after said exposing the structure to the first plasma is performed, forming a polysilicon layer on the oxidized layer.

2. The method of claim 1, wherein said exposing the structure to the first plasma is performed such that first atoms of the removed oxygen atoms are pushed out of the oxidized layer, and such that second atoms of the removed oxygen atoms chemically react with species of the first plasma to form a volatile substance.

3. The method of claim 1, further comprising, after said exposing the structure to the first plasma is performed, heating the structure at a first pre-specified temperature.

4. The method of claim 3,
wherein the first pre-specified temperature is in a range from room temperature to 800C, and
wherein the gate layer comprises a metal.

5. The method of claim 1,
wherein the gate layer comprises a metal, and
wherein said exposing the structure to the first plasma is performed at a temperature in a range from room temperature to 800C.

6. The method of claim 1, wherein the first plasma is selected from the group consisting of N plasma, H plasma, NH3 plasma, and CH4 plasma.

7. The method of claim 1, further comprising, after said forming the polysilicon layer is performed, removing portions of the polysilicon layer, the gate layer, and gate dielectric layer by a lithographic and etching process so as to form a gate stack which includes remaining portions of the polysilicon layer, the gate layer, and gate dielectric layer.

8. The method of claim 7, further comprising, after said removing the portions is performed, exposing the gate stack to a second plasma resulting in removal of oxygen atoms from the gate stack.

9. The method of claim 8, wherein said exposing the structure to the first plasma and said exposing the gate stack to the second plasma are performed at about same pressures and temperatures.

10. The method of claim 1, wherein said exposing the structure to the first plasma and said forming the polysilicon layer on the oxidized layer are performed in a controlled environment which essentially does not contain oxygen atoms.

11. The method of claim 1, wherein said exposing the structure to the first plasma is performed in a first chamber, wherein said forming the polysilicon layer is performed in a second chamber, and wherein the first and second chambers belong to a same tool.

12. The method of claim 1, wherein the first plasma is nitrogen plasma, and wherein the gate layer comprises a material whose molecules contain nitrogen atoms.

13. The method of claim 1, wherein the first plasma is hydrogen plasma, and wherein the gate layer comprises a metal.

14. The method of claim 1, wherein the structure further comprises an electrically conducting layer disposed between, and in direct physical contact with, the gate dielectric layer and the oxidized layer.

15. The method of claim 14, wherein the gate dielectric layer comprises a dielectric material, and wherein the dielectric material of the gate dielectric layer and the oxidized material of the oxidized layer are different materials.

16. The method of claim 15, wherein the dielectric material of the gate dielectric layer is a high-k dielectric material.

17. The method of claim 15, wherein the dielectric material of the gate dielectric layer is silicon dioxide.

18. The method of claim 15, wherein the electrically conducting layer comprises a metal or a metal nitride.

* * * * *